(12) United States Patent
Birau et al.

(10) Patent No.: US 7,705,346 B2
(45) Date of Patent: Apr. 27, 2010

(54) BARRIER LAYER FOR AN ORGANIC ELECTRONIC DEVICE

(75) Inventors: Mihaela Maria Birau, Missisauga (CA); Yu Qi, Oakville (CA); Yiliang Wu, Mississauga (CA); Beng S. Ong, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 171 days.

(21) Appl. No.: 11/145,701

(22) Filed: Jun. 6, 2005

(65) Prior Publication Data

US 2006/0273302 A1 Dec. 7, 2006

(51) Int. Cl.
*H01L 51/05* (2006.01)

(52) U.S. Cl. ............ 257/40; 257/E51.006; 252/188.28

(58) Field of Classification Search .................... 257/40, 257/E51.001–E51.052; 438/99; 252/188.28
See application file for complete search history.

(56) References Cited

U.S. PATENT DOCUMENTS

| | | | | |
|---|---|---|---|---|
| 3,700,754 | A * | 10/1972 | Schmitt et al. ............... | 525/309 |
| 4,378,392 | A * | 3/1983 | Segel ......................... | 428/40.7 |
| 5,711,987 | A * | 1/1998 | Bearinger et al. ............. | 427/7 |
| 6,506,438 | B2 * | 1/2003 | Duthaler et al. ............... | 427/58 |
| 6,518,949 | B2 * | 2/2003 | Drzaic ........................ | 345/107 |
| 6,621,099 | B2 | 9/2003 | Ong et al. | |
| 6,759,461 | B2 * | 7/2004 | Wu et al. ..................... | 524/150 |
| 6,774,393 | B2 | 8/2004 | Murti et al. | |
| 6,774,904 | B2 | 8/2004 | Emerson et al. | |
| 6,781,148 | B2 * | 8/2004 | Kubota et al. ................. | 257/40 |
| 6,929,870 | B2 * | 8/2005 | Ishida et al. ................. | 428/690 |
| 2002/0155729 | A1 * | 10/2002 | Baldwin et al. ............. | 438/780 |
| 2003/0077437 | A1 | 4/2003 | Nakamura et al. | |
| 2003/0160234 | A1 | 8/2003 | Ong et al. | |
| 2004/0102529 | A1 * | 5/2004 | Campbell et al. ............. | 516/79 |
| 2004/0222412 | A1 | 11/2004 | Bai et al. | |
| 2004/0245541 | A1 | 12/2004 | Shitagaki et al. | |
| 2004/0258921 | A1 | 12/2004 | Watanabe et al. | |
| 2005/0029514 | A1 * | 2/2005 | Moriya ......................... | 257/40 |
| 2005/0032268 | A1 * | 2/2005 | Nishikawa et al. ............ | 438/99 |
| 2005/0196972 | A1 * | 9/2005 | Eder et al. ................... | 438/778 |
| 2005/0287728 | A1 * | 12/2005 | Arias ......................... | 438/197 |
| 2006/0131561 | A1 * | 6/2006 | Hirai et al. ................... | 257/40 |
| 2006/0192197 | A1 * | 8/2006 | Koganei ....................... | 257/40 |
| 2007/0199729 | A1 * | 8/2007 | Siegel et al. ................. | 174/73.1 |

FOREIGN PATENT DOCUMENTS

| | | |
|---|---|---|
| EP | 1 434 281 | 6/2004 |
| EP | 1 478 212 | 11/2004 |
| WO | WO 2004/009720 | 1/2004 |
| WO | WO 2004088767 A1 * | 10/2004 |

OTHER PUBLICATIONS

EP Search Report.

* cited by examiner

*Primary Examiner*—Matthew W Such
(74) *Attorney, Agent, or Firm*—Fay Sharpe LLP

(57) ABSTRACT

A novel barrier layer which protects electronic devices from adverse environmental effects such as exposure to light, oxygen and/or moisture is described. The barrier layer comprises a polymer, an antioxidant, and an inorganic particulate material.

28 Claims, 2 Drawing Sheets

BARRIER LAYER FOR AN ORGANIC ELECTRONIC DEVICE

STATEMENT REGARDING FEDERALLY SPONSORED RESEARCH OR DEVELOPMENT

This invention was made with U.S. Government support under Cooperative Agreement No. 70NANBOH3033 awarded by the National Institute of Standards and Technology (NIST). The U.S. Government has certain rights in the invention.

BACKGROUND

The present disclosure relates, in various embodiments, to a novel protective barrier layer composition for the protection of organic electronic devices from adverse environmental effects such as exposure to light, oxygen, or moisture, or a combination of these factors Thin film transistors ("TFT"s) are fundamental building blocks of electronic circuits. Structurally, TFT comprises a supporting substrate, three electrically conductive electrodes (gate, source and drain electrodes), a semiconductor layer, and a dielectric layer. For operational stability and extended life, it is often necessary to protect the TFTs from adverse environmental effects with a protective barrier layer. Various TFT configurations are possible to enable proper functioning of TFTs in various electronic applications. Exemplary configurations are depicted in FIGS. 1 through 4. The semiconductor is electrically insulating when the transistor is in its switched-off state, when no bias voltage is applied to the gate electrode. When a bias voltage is applied to the gate electrode, the transistor is switched on, an electric current flows between the source and the drain electrodes through the semiconductor layer. At a given source-drain electric field, the current flowing between the source-drain electrodes can be modulated by the bias voltage applied to the gate electrode Exposure to various environmental conditions can adversely affect the performance of an electronic device such as organic TFT (OTFT). For example, the organic semiconductor layer can be damaged by light, oxygen and moisture, etc. degrading its electrical properties. Consequently, TFTs need to be protected from these environmental conditions with a protective barrier or encapsulation layer. For inorganic material-based TFTs such as amorphous silicon TFTs, this is traditionally done by passivation with a vacuum deposited inorganic oxide layer (e.g., silicon nitrides). For low-cost OTFTs, a liquid-processable barrier layer would be preferable to lower manufacturing cost.

Prior-art OTFT barrier or encapsulation layers consist of polymers like polyvinylphenol, polymethylmethacrylate (PMMA), polyethylene, polyethyleneterephthalate, and mixtures of these polymers. However, these polymers have high oxygen and water permeability and cannot function as satisfactory barrier layers for OTFTs. Other prior-art barrier approaches include multilayer encapsulations containing dessicants or oxygen scavengers and an in-situ polymerized polymer layer. However, these approaches are also not very effective in protecting OTFTs against environmental conditions. For example, dessicants have a finite capacity to absorb moisture and will cease to function once they are saturated with moisture. Multilayer barrier layers are more costly to apply to OTFTs than a single barrier layer and are therefore less preferred.

BRIEF DESCRIPTION

The present disclosure is directed to a class of novel barrier or encapsulation layers which can protect OTFTs from the degradative effects of ambient light, moisture and atmospheric oxygen as well as other agents present in ambient atmosphere. This class of barrier layers comprises a polymer, an antioxidant, and an inorganic particulate material. These barrier layers work effectively in protecting the OTFTs when all three components are present and are not efficient when one or more components are absent.

In embodiments according to the present disclosure, the inorganic particulate material is a modified inorganic oxide. In further embodiments, it is a modified metal oxide.

In another embodiment according to the present disclosure, the antioxidant is 2-hydroxy-4-octyloxybenzophenone and the metal oxide is modified aluminum oxide ($Al_2O_3$). They are dispersed in a polymer such as PMMA and applied as a protective layer to OTFTs.

These and other non-limiting characteristics of the present disclosure are more particularly described below.

DESCRIPTION OF THE DRAWINGS

Illustrated in FIGS. 1 to 4 are various representative embodiments of the present disclosure and wherein at least one functions as a protection layer, and wherein polythiophenes may be selected as the channel materials in thin film transistor (TFT) configurations.

DETAILED DESCRIPTION

The present disclosure provides a novel class of barrier layers for OTFTs which are suitable for application in electronic devices. The barrier layer is meant to protect the electronic devices from exposure to ambient light and environmental constituents such as water, oxygen, and other agents in the air.

A TFT comprises of three electrodes (a gate, a source and a drain electrode), a dielectric layer, a semiconductor layer, a substrate and a barrier layer which may also be referred to as encapsulation layer.

Figure 1:
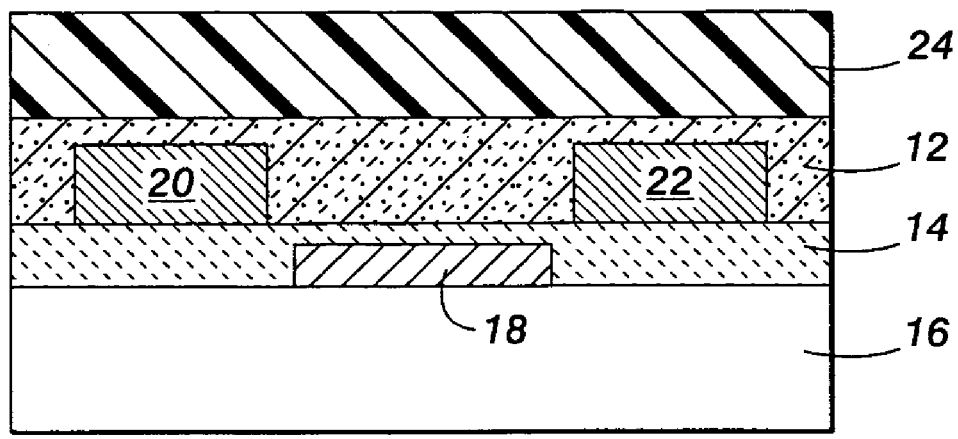

In FIG. 1 there is schematically illustrated a TFT configuration 10 comprised of a layer 16, of a heavily n-doped silicon wafer 18, which functions both as a substrate and a gate electrode; a thermally grown silicon oxide gate dielectric layer 14 on top of which are deposited two metal electrodes, 20 and 22 (source and drain electrodes). Over and between the metal electrodes 20 and 22 is the semiconductor or active layer 12, and which layer can be comprised of various suitable components, such as the polythiophenes illustrated herein. The barrier layer 24 is deposited on and is in contact with layer 12.

Figure 2:
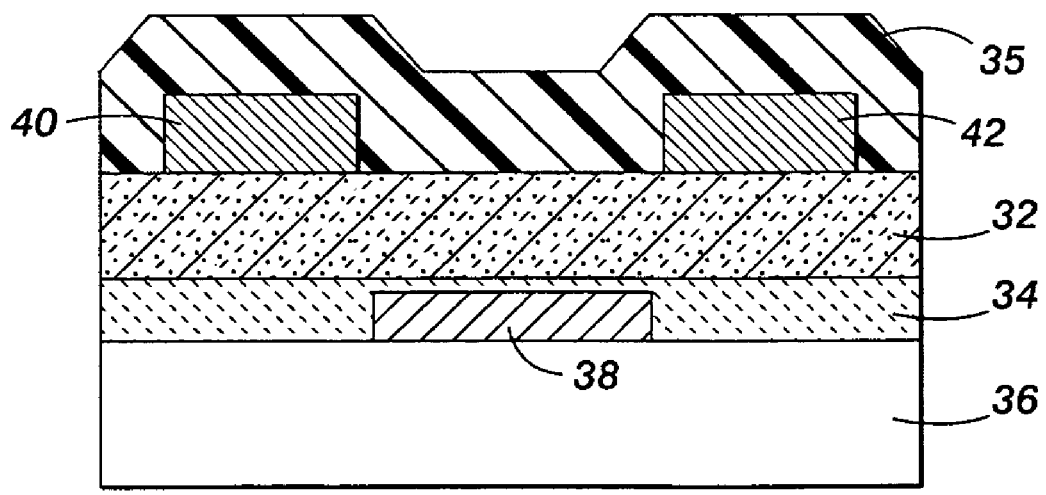

FIG. 2 schematically illustrates another TFT configuration 30 comprised of a substrate 36, a gate electrode 38, a source electrode 40, and a drain electrode 42, a gate dielectric layer 34, an organic semiconductor layer 32, and a barrier layer 35.

Figure 3:
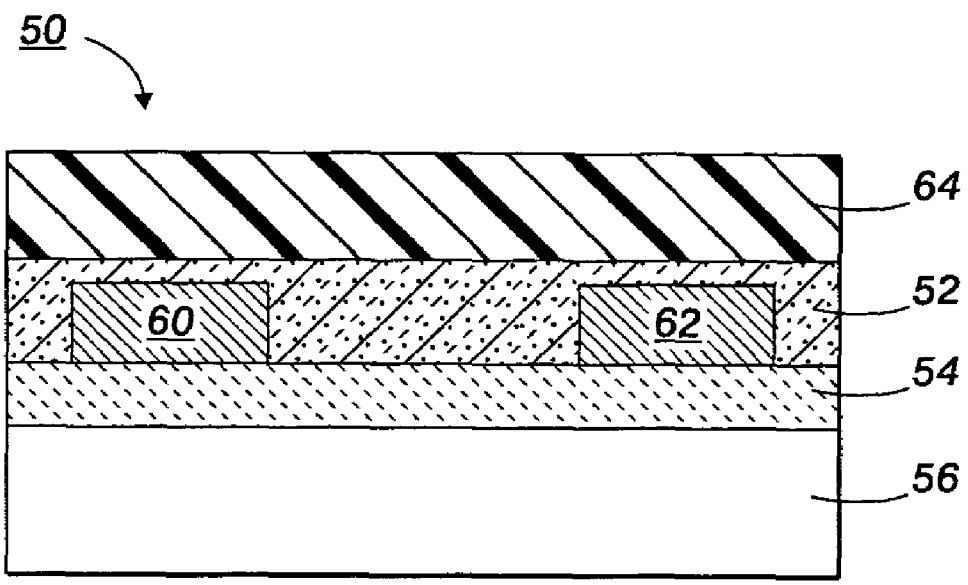

FIG. 3 schematically illustrates a further TFT configuration 50 comprised of a heavily n-doped silicon wafer 56, which functions as both a substrate and a gate electrode, a thermally grown silicon oxide dielectric layer 54, an organic semiconductor, such as a polythiophene as illustrated herein, layer 52, on top of which are deposited a source electrode 60 and a drain electrode 62; and a barrier layer 64 in contact with layer 52.

Figure 4:
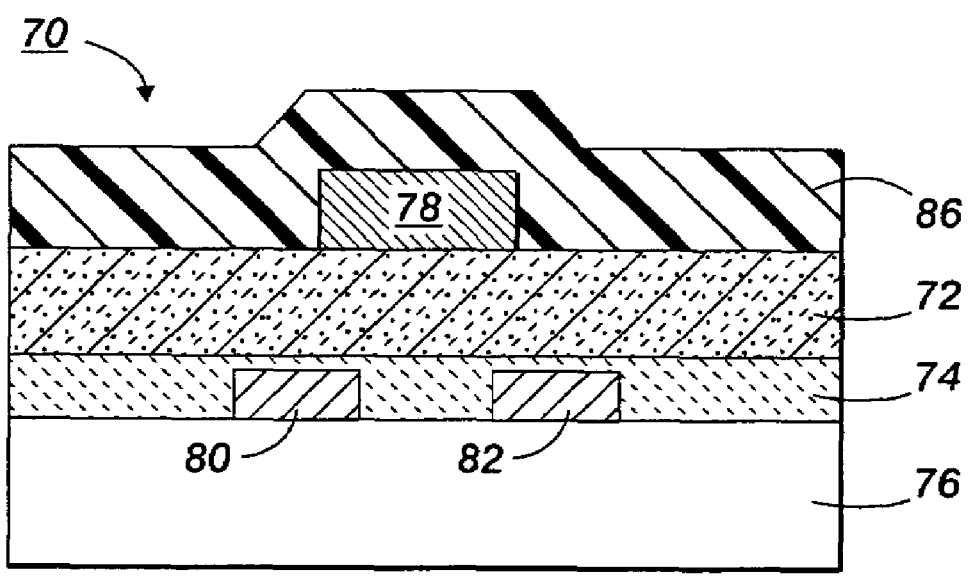

FIG. 4 schematically illustrates yet a further TFT configuration 70 comprised of substrate 76, a gate electrode 78, a source electrode 80, a drain electrode 82, an organic semiconductive layer 72, a dielectric layer 74, and wherein layer 72 is in contact with and encapsulated by a barrier layer 86.

Also, other devices not disclosed, especially TFT devices, are envisioned, reference for example known TFT devices.

The barrier layer of the present disclosure in embodiments comprises three components: a polymer, an antioxidant, and an inorganic particulate material. The barrier layer is applied as a single layer to the organic electronic device, such as an OTFT. The barrier layer generally has a thickness of from about 50 nm to about 50 microns. In further embodiments, it has a thickness of from about 100 nanometers to about 10 microns.

The polymer of the barrier layer can be selected from any polymer which is mechanically robust and has good adhesion to the surface, and which can be processed through a liquid deposition technique such as spin coating, dipping, evaporative coating or printing. Polymers which may be used include, but are not limited to polyolefins, parafin waxes, polyacrylates, polymethacrylates, polyimides, polyvinyls, polyesters, polysulfones, polyetherketones and polycarbonates. In further embodiments, the polymer is an acrylate or methacrylate polymer such as PMMA. The polymer usually comprises from about 5 to about 99 weight percent of the barrier layer based on the total weight of the barrier layer. In further embodiments, it comprises from about 20 to about 95 weight percent of the barrier layer based on the total weight of the barrier layer.

The antioxidant of the present disclosure can be selected from any antioxidant which acts as an oxygen scavenger. The antioxidant is chosen to be compatible with the selected polymer. An antioxidant should disperse easily in the selected polymer and not disrupt the smoothness of the film surface through crystallization. Antioxidants which may be used include, but are not limited to derivatives of benzophenone, substituted benzophenones, triazine, substituted triazines, benzotriazole, substituted benzotriazoles, phosphites, and mixtures thereof. Substituted benzophenones include but are not limited to 2-hydroxy-4-octyloxybenzophenone, 2',4'-dihydroxy-3'-propylacetophenone, 2-hydroxy-4-methoxybenzophenone. In further embodiments, the antioxidant is 2-hydroxy-4-octyloxybenzophenone. The antioxidant usually comprises from about 0.1 to about 10 weight percent of the barrier layer based on the total weight of the barrier layer. In further embodiments, it comprises from about 0.1 to about 5 weight percent of the barrier layer based on the total weight of the barrier layer. More than one antioxidant may be used if desired.

The inorganic particulate material of the present disclosure can be selected from any inorganic material which is a "high-density material". A high-density material is a material with atomic spacing sufficiently close such that diffusion of outside species like water is hindered. Preferred high-density materials include inorganic materials such as metal oxides. Inorganic oxides are usually selected because they act as a moisture barrier. Preferred metal oxides are silicon oxides ($SiO_x$) including silicon monoxide (SiO) and silicon dioxide ($SiO_2$), silicon oxynitrides, aluminum oxides, and a mixture thereof. In further embodiments, a metal oxide is used because it is easy to be modified and therefore easy to disperse in a polymer such as PMMA. In a further embodiment, aluminum oxide ($Al_2O_3$) is used.

In embodiment, the inorganic particulate material is also surface modified to be compatible with the selected polymer. This is generally done, but not limiting to, by coating the particles with a silane coupling agent of formula R—$Si(X)_n$ $Y_{3-n}$ wherein R and X each other represent an alkyl group from about 1 to 60 carbon atoms, a substituted alkyl group from about 1 to 60 carbon atoms, or a substituted aryl group from about 6 to 60 carbon atoms. An alkyl or substituted alkyl group can be selected from a group consisting of methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, chloromethyl, methoxyethyl, methoxypropyl, methoxybutyl, methylbutyl, methylpentyl, fluoromethyl, phenylmethyl, benzyl, phenylethyl, perfluoroalkyl such as difluoroethyl, trifluoroethyl, trifluoropropyl, and tridecafluoro-1,1,2,2,-tetrahydrooctyl, while an aryl group can be selected from a group consisting of phenyl, tolyl, xylyl, chlorophenyl, dichlorophenyl, methoxyphenyl, cyanophenyl, ethylphenyl, ethoxyphenyl, propylphenyl, biphenyl, and perfluorophenyl, and the like. Y represents an active group that enables the attachment of the silane molecule on the metal oxide. That can be a halogen atom for example chlorine atom, a hydroxyl atom, and an alkoxy group. n represents an integer of 0, 1, and 2. Preferred silane coupling reagents are selected from, but not limited to, a group consisting of methyltrimethoxisilane, methyltriclorosilane, ethyltrimethoxysilane, ethyltrichlorosilane, methyltriethoxysilane, propyltrimethoxysilane, propyltriclorosilane, phenyltrimethoxysilane, phenyltriclorosilane, phenylethyltrimethoxysilane, phenylethyltrioclorosilane, octyltrimethoxysilane, octyltrichlorosilane, tolyltrimethoxysilane, tolyltrichlorosilane, benzyltrimethoxysilane, benzyltrichlorosilane, diphenyldimethoxysilane, diphenyldichlorosilane, diphenyldisilanol, and mixtures of thereof. In further embodiments the silane reagents are selected from a group consisting of phenyltrimethoxysilane, phenylethyltrimethoxysilane, benzyltrimethoxysilane, and p-tolyltrimethoxysilane. In a further embodiment phenylethyltrimethoxysilane is used.

The inorganic particulate material is usually from about 0.5 to about 50 weight percent of the barrier layer based on the total weight of the barrier layer. In further embodiments, it comprises from about 0.5 to about 10 weight percent of the barrier layer based on the total weight of the barrier layer. More than one inorganic particulate material may be used if desired.

The three components of the barrier layer are easily processed into a dispersion in a liquid by dispersing them in organic solvents such as toluene, hexane, heptane, ethyl acetate, acetone. The dispersion can then be applied to an OTFT using any liquid deposition methods known in the art. Such methods include, but are not limited to, spin coating, dip coating, casting, and printing.

Substrate

The substrate may be opaque or substantially transparent. It can comprise any suitable organic or inorganic material having the requisite mechanical properties. It may be composed of for instance silicon wafer, glass plate, plastic film or sheet. For structurally flexible devices, a plastic substrate, such as for example polyester, polycarbonate, polyimide sheets and the like may be preferred. The thickness of the substrate may be from about 10 micrometers to over about 10 millimeters with an exemplary thickness being from about 50 to about 100 micrometers, especially for a flexible plastic substrate and from about 1 to about 10 millimeters for a rigid substrate such as glass plate or silicon wafer.

Electrodes

The gate electrode can be a thin metal film, a conducting polymer film, a conducting film made from conducting ink or paste, or the substrate itself can be the gate electrode, for example heavily doped silicon. Examples of gate electrode materials include but are not restricted to aluminum, gold, chromium, indium tin oxide, conducting polymers such as polystyrene sulfonate-doped poly(3,4-ethylenedioxythiophene) (PSS-PEDOT), conducting ink/paste comprised of carbon black/graphite or colloidal silver dispersion in polymer binders, such as ELECTRODAG™ available from Acheson Colloids Company. The gate electrode can be prepared by vacuum evaporation, sputtering of metals or conductive metal oxides, coating from conducting polymer solutions or conducting inks by spin coating, casting or printing. The thickness of the gate electrode ranges for example from about 10 to about 200 nanometers for metal films and in the range of about 1 to about 10 micrometers for polymer conductors.

The source and drain electrodes can be fabricated from materials which provide a low resistance ohmic contact to the semiconductor. Typical materials suitable for use as source and drain electrodes include those of the gate electrode materials such as gold, nickel, aluminum, platinum, conducting polymers and conducting inks. Typical thicknesses of source and drain electrodes are about, for example, from about 40 nanometers to about 10 micrometers with the more specific thickness being about 100 to about 400 nanometers.

Semiconductor

Materials suitable for use as the organic semiconductor include acenes, such as anthracene, tetracene, pentacene, and substituted pentacenes, perylenes, fullerenes, phthalocyanines, oligothiophenes, polythiophenes, and substituted derivatives thereof. In embodiments, the organic semiconductor layer is formed from a liquid processable material. Examples of suitable semiconductor materials include polythiophenes, oligothiophenes, and the semiconductor polymers described in U.S. application Ser. No. 10/042,342, which is published as U.S. Patent Application No. 2003/0160234, and U.S. Pat. Nos. 6,621,099, 6,774,393, and 6,770,904, the disclosures of which are incorporated herein by reference in their entireties. Additionally, suitable materials include the semiconductor polymers disclosed in "Organic Thin Film Transistors for Large Area Electronics" by C. D. Dimitrakopoulos and P. R. L. Malenfant, Adv. Mater., Vol. 12, No. 2, pp. 99-117 (2002), the disclosure of which is also incorporated herein by reference.

The semiconductor layer may be formed by any suitable means including but not limited to vacuum evaporation, spin coating, solution casting, dip coating, stencil/screen printing, flexography, gravure, offset printing, inkjet-printing, microcontact printing, a combination of these processes, and the like. In embodiments, the semiconductor layer is formed by a liquid deposition method. In embodiments, the semiconductor layer has a thickness of from about 10 nanometers to about 1 micrometer. In further embodiments, the organic semiconductor layer has a thickness of from about 30 to about 150 nanometers. In other embodiments, the semiconductor layer has a thickness of from about 40 to about 100 nanometers.

Gate Dielectric

The dielectric layer which separates the gate electrode from the source and drain electrodes, and is in contact with the semiconductor layer, can generally be an inorganic material film, an organic polymer film, or an inorganic-inorganic composite film. The thickness of the dielectric layer is, for example, from about 10 nanometers to about 1 micrometer with a more specific thickness being about 100 nanometers to about 500 nanometers. Illustrative examples of inorganic materials suitable as the dielectric layer include silicon oxide, silicon nitride, aluminum oxide, barium titanate, barium zirconate titanate, and the like; illustrative examples of organic polymers for the dielectric layer include polyesters, polycarbonates, poly(vinyl phenol), polyimides, polystyrene, poly(methacrylate)s, poly(acrylate)s, epoxy resin, and the like; and illustrative examples of inorganic-organic composite materials include nanosized metal oxide particles dispersed in polymers such as polyester, polyimide, epoxy resin and the like. The insulating dielectric layer is generally of a thickness of from about 50 nanometers to about 500 nanometers depending on the dielectric constant of the dielectric material used. More specifically, the dielectric material has a dielectric constant of, for example, at least about 3, thus a suitable dielectric thickness of about 300 nanometers can provide a desirable capacitance, for example, of about $10^{-9}$ to about $10^{-7}$ F/cm$^2$.

Barrier or Encapsulation Layer

Illustrative compositions and methods of formation of the protective barrier or encapsulation layers of the present disclosure are described herein.

While particular embodiments of the present disclosure have been described, alternatives, modifications, variations, improvements, and substantial equivalents that are or may be presently unforeseen may arise to applicants or others skilled in the art. Accordingly, the present disclosure is intended to embrace all such alternatives, modifications variations, improvements, and substantial equivalents.

The following examples illustrate OTFTs according to the present disclosure. The examples are merely illustrative and are not intended to limit the present disclosure with regard to the materials, conditions, or process parameters set forth therein.

EXAMPLE 1

Bottom-contact TFTs were fabricated in the following manner. The TFTs were comprised of an n-doped silicon wafer with a thermally grown silicon oxide layer having a thickness of about 110 nanometers. The wafer functioned as the gate electrode while the silicon oxide layer functioned as the dielectric layer and had a capacitance of about 30 nanofarads per square centimeter (nF/cm2) as measured with a capacitor meter. The silicon wafer was first cleaned with isopropanol, air dried, and then immersed in a 0.1 M solution of octyltrichlorosilane in toluene for 20 minutes at 60° C. The wafer was subsequently washed with toluene and isopropanol and dried. A 30-nm thin film of PQT-12 semiconductor layer, reference the publication by B. S. Ong, et al., Journal of American Chemical Society, volume 126, pages 3378-3379 (2004), was deposited by spin coating, dried in a vacuum oven, and then heated at 140° C. for 10-30 min. An array of gold source-drain electrode pairs with a film thickness of about 60 nm and various channel lengths and widths was subsequently deposited on top of the semiconductor by vacuum evaporation of gold through a shadow mask.

The barrier layer was composed of 1 weight percent of 2-hydroxy-4-octyloxybenzophenone and 5 weight percent of modified Al$_2$O$_3$ particles dispersed in 94 weight percent of PMMA, all percentages based on the weight of the barrier layer. The Al$_2$O$_3$ particles were modified by first dispersing in a solution of a silane coupling agent such as phenylethyltrimethoxysilane in an organic solvent such as isopar, dodecane, toluene and chlorobenzene. The resulting suspension was sonicated and heated at an elevated temperature from about 50 to 250° C. After cooling to room temperature, the dispersion was centrifuged and the solvent was decanted. The remaining solids were washed several times with a lower boiling point solvent such as hexane or heptane, and finally dried at about 100° C. for about 1 to about 24 hours. A coating dispersion was prepared by dispersing 0.865 grams of PMMA, 0.008 grams of 2-hydroxy-4-octyloxybenzophenone, and 0.043 grams of the modified $Al_2O_3$ particles in 8.9 mL toluene. The dispersion was deposited on top of the TFTs by spin coating and dried at about 60° C. for about 1 to about 3 hours. The thickness of the barrier layer was about 770 nanometers.

The TFTs were evaluated by measuring their output and transfer curves using a Keithley 4200 Semiconductor characterization system immediately after encapsulation and over a period of 30 days after storage in air under yellow light.

The device of Example 1 exhibited very little performance degradation over a 30-day period: the mobility showed a decrease of about 10% while the current on/off ratio remained unchanged.

COMPARATIVE EXAMPLE 1

A set of comparative TFTs were fabricated according to the procedure of Example 1 except that the barrier layer was composed of 100 percent PMMA. A coating solution of 0.865 grams PMMA in 9.0 mL of toluene was deposited on the TFTs by spin coating followed by drying at 60° C. for about 1 to about 3 hours. The resulting barrier layer has a thickness of 670 nanometers.

When evaluated similarly as in Example 1, the TFTs of comparative Example 1 showed significant performance degradation after 30 days: the mobility dropped to half of its original value and the current on/off ratio decreased by more than an order of magnitude.

COMPARATIVE EXAMPLE 2

Another set of comparative TFTs were fabricated according to the procedure of Example 1 except that the barrier layer was composed of 5 weight percent of modified $Al_2O_3$ particles dispersed in 95 weight percent of PMMA without the antioxidant, 2-hydroxy-4-octyloxybenzophenone. Both percentages are based on the total weight of the barrier layer. The coating dispersion was prepared by dispersing 0.865 grams of PMMA and 0.043 grams of modified $Al_2O_3$ particles in 8.9 mL of toluene. The dispersion was deposited on the TFTs by spin coating and drying at 60° C. for about 1 to about 3 hours. The thickness of the barrier layer was 750 nanometers.

These comparative TFTs exhibited significant performance degradation after 30 days: the mobility dropped to half of its original value and the current on/off ratio decreased by more than an order of magnitude.

COMPARATIVE EXAMPLE 3

A further set of comparative TFTs were fabricated according to the procedure of Example 1 except the barrier layer was composed of 1 weight percent of 2-hydroxy-4-octyloxybenzophenone dispersed in 99 weight percent of PMMA without the modified $Al_2O_3$ particles. Both percentages are based on the total weight of the barrier layer. A coating dispersion was prepared by dispersing 0.865 grams of PMMA and 0.008 grams of 2-hydroxy-4-octyloxybenzophenone in 9 mL of toluene. The dispersion was deposited on the TFTs by spin coating and drying at 60° C. for about 1 to about 3 hours. The thickness of the barrier layer was 700 nanometers.

These comparative TFTs also showed significant performance degradation in 30-days: the mobility was reduced by two-thirds of its original value and the current on/off ratio decreased by more than an order of magnitude.

The above results clearly demonstrate the effectiveness of a barrier layer according to the present disclosure.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. An organic thin film transistor comprising a substrate, a gate electrode, a semiconductor layer, and a barrier layer;
   wherein the gate electrode and the semiconductor layer are located between the substrate and the barrier layer;
   wherein the substrate is a first outermost layer of the transistor and the barrier layer is a second outermost layer of the transistor; and
   wherein the barrier layer comprises a polymer, an antioxidant, and a surface modified inorganic particulate material.

2. The transistor of claim 1, wherein the polymer is selected from the group consisting of polyolefins, paraffin waxes, polyacrylates, polyimides, polyesters, polyvinyls, polycarbonates, polysulfones, and polyetherketones.

3. The transistor of claim 1, wherein the polymer is selected from the group consisting of polymethylmethacrylate, polyvinyl pyridine, polystyrene, and polyvinylbutyral.

4. The transistor of claim 1, wherein the polymer is polymethylmethacrylate.

5. The transistor of claim 1, wherein the polymer comprises from about 5 to about 98 weight percent of the barrier layer based on the total weight of the barrier layer.

6. The transistor of claim 1, wherein the polymer comprises from about 20 to about 90 weight percent of the barrier layer based on the total weight of the barrier layer.

7. The transistor of claim 1, wherein the antioxidant is selected from the group consisting of derivatives of benzophenone, substituted benzophenones, triazine, substituted triazines, benzotriazol, substituted benzotriazoles, phosphites, and mixture thereof.

8. The transistor of claim 1, wherein the antioxidant is a substituted benzophenone.

9. The transistor of claim 1, wherein the antioxidant is 2-hydroxy-4-octyloxybenzophenone.

10. The transistor of claim 1, wherein the antioxidant comprises from about 0.1 to about 10 weight percent of the barrier layer based on the total weight of the barrier layer.

11. The transistor of claim 1, wherein the antioxidant comprises from about 0.5 to about 5 weight percent of the barrier layer based on the total weight of the barrier layer.

12. The transistor of claim 1, wherein the surface modified inorganic particulate material is an inorganic oxide.

13. The transistor of claim 12, wherein the inorganic oxide is a metal oxide.

14. The transistor of claim 12, wherein the inorganic oxide is selected from the group consisting of aluminum oxides, silicon oxides, silicon oxynitrides, and combinations thereof.

15. The transistor of claim 1, wherein the surface modified inorganic particulate material comprises from about 0.5 to about 50 weight percent of the barrier layer based on the total weight of the barrier layer.

16. The transistor of claim 15, wherein the surface modified inorganic particulate material comprises from about 0.5 to about 10 weight percent of the barrier layer based on the total weight of the barrier layer.

17. The transistor of claim 1, wherein the inorganic particulate material has a particle size from about 1 nm to 500 nm.

18. The transistor of claim 1, wherein the surface modified inorganic particulate material is surface-modified with a silane reagent of formula

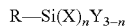

wherein R and X each independently represents an alkyl group of from about 1 to about 60 carbon atoms, an aryl group of from about 6 to about 60 carbon atoms, a substituted alkyl group of from 1 to about 60 carbon atoms, or a substituted aryl group of from about 6 to about 60 carbon atoms; Y represents a reactive group that enables the attachment of the silane reagent onto the metal oxide particle surface; and n represents an integer having a value of 0,1, or 2.

19. The transistor of claim 18 wherein at least one of R and X is an alkyl group and wherein said alkyl group is selected from the group consisting of methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, and said aryl group is selected from the group consisting of phenyl, tolyl, xylyl, chlorophenyl, dichlorophenyl, methoxyphenyl, cyanophenyl, ethylphenyl, ethoxyphenyl, propylphenyl, biphenyl, and perfluorophenyl.

20. The transistor of claim 18 wherein at least one of R and X is a substituted alkyl group and wherein said substituted alkyl group is selected from the group consisting of chioromethyl, methoxyethyi, methoxypropyl, methoxybutyl, methylbutyl, methylpentyl, fluoromethyl, difluoroethyl, trifluoroethyl, phenylmethyl, methoxypropyl, benzyl, phenylethyl, trifluoropropyl, and tridecafluoro-1,1,2,2,-tetrahydrooctyl.

21. The transistor of claim 18 wherein at least one of R and X is a substituted alkyl group and wherein said substituted alkyl group is perflouroalkyl.

22. The transistor of claim 18 wherein said Y is selected from the group consisting of a halogen atom, a hydroxyl group, and an alkoxy group.

23. The transistor of claim 22 wherein said alkoxy group is selected from the group consisting of methoxy, ethoxy, propoxy, isopropoxy.

24. The transistor of claim 18 wherein said silane reagents are selected from the group consisting of methyltrimethoxysilane, methyltrichiorosilane, ethyltrimethoxysilane, ethyltrichlorosilane, methyltriethoxysilane, propyltrimethoxysilane, propyltrichlorosilane, phenyltrimethoxysilane, phenyltrichlorosilane, phenylethyltrimethoxysilane, phenylethyltrichiorosilane, octyltrimethyoxysilane, octyltrichlorosilane, p-tolyltrimethoxysilane, tolyltrichlorosilane, benzyltrimethoxysilane, benzyltrichlorosilane, diphenyldimethoxysilane, diphenyldichlorosilane, diphenyldisilanol, 3,3,3-trifluoropropyltrimethoxysilane, heptadecafluoro-1,1,2,2-tetrahydrodecyl)triethoxysilane and mixtures thereof.

25. The transistor of claim 18 wherein said silane reagents are selected from the group consisting of phenyltrimethoxysilane, phenylethyltrimethoxysilane, benzyltrimethoxysilane, p-tolyltrimethoxysilane methyltrimethoxysilane 3,3,3-trifluoropropyltrimethoxysilane and heptadecafluoro-1,1,2,2,-tetrahydrodecyl)triethoxysilane.

26. The transistor of claim 1, wherein the thickness of the barrier layer is about 100 nm to 10 μm.

27. An organic thin film transistor comprising a substrate, a gate electrode, a dielectric layer, a source electrode, a drain electrode, a semiconductor layer and a barrier layer;
   wherein the substrate and the barrier layer encapsulate the gate electrode, dielectric layer, source electrode, drain electrode, and the semiconductor layer;
   wherein the substrate is a first outermost layer of the transistor and the barrier layer is a second outermost layer of the transistor; and
   the barrier layer consists of a surface modified inorganic particulate material, an antioxidant and a polyacrylate polymer.

28. An organic thin film transistor consisting of a substrate, a gate electrode, a dielectric layer, a source electrode, a drain electrode, a semiconductor layer and a barrier layer;
   wherein the gate electrode, dielectric layer, source electrode, drain electrode, and the semiconductor layer are located between the substrate and the barrier layer; and
   the barrier layer consists of surface modified $Al_2O_3$ particles, 2-hydroxy-4-octyloxybenzophenone, and a polyacrylate polymer.

* * * * *

UNITED STATES PATENT AND TRADEMARK OFFICE
CERTIFICATE OF CORRECTION

PATENT NO. : 7,705,346 B2  
APPLICATION NO. : 11/145701  
DATED : April 27, 2010  
INVENTOR(S) : Maria Birau et al.

It is certified that error appears in the above-identified patent and that said Letters Patent is hereby corrected as shown below:

In the Specification:

Column 1, line 9, after "Cooperative Agreement No.", please delete "70NANBOH3033" and insert --70NANB0H3033--.

Signed and Sealed this  
Tenth Day of September, 2013

Teresa Stanek Rea  
*Acting Director of the United States Patent and Trademark Office*